United States Patent
Minemier

(10) Patent No.: US 9,535,111 B2
(45) Date of Patent: Jan. 3, 2017

(54) OPTICAL TRANSMISSION OF TEST DATA FOR TESTING INTEGRATED CIRCUITS

(75) Inventor: Ronald K. Minemier, Tempe, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 500 days.

(21) Appl. No.: 13/976,977

(22) PCT Filed: Dec. 27, 2011

(86) PCT No.: PCT/US2011/067435
§ 371 (c)(1),
(2), (4) Date: Jun. 27, 2013

(87) PCT Pub. No.: WO2013/100917
PCT Pub. Date: Jul. 4, 2013

(65) Prior Publication Data
US 2014/0203837 A1    Jul. 24, 2014

(51) Int. Cl.
G01R 31/02    (2006.01)
G01R 31/28    (2006.01)
G01R 31/302   (2006.01)

(52) U.S. Cl.
CPC ....... *G01R 31/2851* (2013.01); *G01R 31/3025* (2013.01)

(58) Field of Classification Search
CPC ............ G01R 31/2851; G01R 31/3025; H04B 10/504; H04B 10/541; H04B 10/2575
See application file for complete search history.

(56) References Cited

U.S. PATENT DOCUMENTS

| | | | |
|---|---|---|---|
| 5,400,343 | A |   3/1995 | Crittenden et al. |
| 5,631,571 | A * | 5/1997 | Spaziani ............... G01R 1/071 324/658 |
| 5,961,728 | A | 10/1999 | Kiser et al. |
| 6,093,938 | A |  7/2000 | Minemier et al. |
| 6,133,862 | A | 10/2000 | Dhuse et al. |
| 6,162,652 | A | 12/2000 | Dass et al. |
| 6,229,158 | B1 |  5/2001 | Minemier et al. |
| 6,438,276 | B1 |  8/2002 | Dhuse et al. |
| 6,614,562 | B1 |  9/2003 | Minemier |
| 6,686,993 | B1 |  2/2004 | Karpman et al. |
| 6,815,973 | B1 | 11/2004 | Conn |
| 7,126,631 | B1 | 10/2006 | Minemier |
| 7,509,541 | B2 |  3/2009 | Minemier |
| 7,904,475 | B2 |  3/2011 | Gladwin et al. |

(Continued)

OTHER PUBLICATIONS

International Search Report and Written Opinion for International Application No. PCT/US2011/067435, dated Oct. 4, 2012, 8 pp.

(Continued)

*Primary Examiner* — Minh N Tang
(74) *Attorney, Agent, or Firm* — Konrad Raynes Davda & Victor LLP

(57) ABSTRACT

In accordance with one aspect of the present description, integrated circuits may tested by optically transmitting test data over a light beam in addition to or instead of transmitting the test data using mechanical probes. Optically transmitted test data is detected by a photon detector on board the die to be tested. Individual circuit portions of the die may be tested using test data associated with each individual circuit portion. Other aspects are described.

9 Claims, 10 Drawing Sheets

(56) References Cited

U.S. PATENT DOCUMENTS

| | | |
|---|---|---|
| 7,953,771 B2 | 5/2011 | Gladwin et al. |
| 7,962,641 B1 | 6/2011 | Dhuse et al. |
| 2005/0127933 A1* | 6/2005 | Wills ............... G01R 31/31728 324/750.3 |
| 2005/0140379 A1* | 6/2005 | Furukawa ............ G01R 31/307 324/750.19 |
| 2006/0010346 A1 | 1/2006 | Minemier |
| 2008/0095531 A1* | 4/2008 | Yeo .................... G02B 26/0808 398/9 |
| 2009/0136235 A1 | 5/2009 | Suh et al. |
| 2011/0148429 A1 | 6/2011 | Minemier |

OTHER PUBLICATIONS

International Preliminary Report on Patentability (IPRP) for International Application No. PCT/US2011/067435, dated Jul. 10, 2014, 5 pp.

Clarke, P., "ST Claims World's First Contactless Wafer Test", EE Times News and Analysis, [online], Dec. 15, 2011, Retrieved from the Internet at <URL: http://www.eetimes.com/electronics-news/4233239/ST-contactless-wafer-test?ci . . . >, 2 pp.

* cited by examiner

OPTICAL TRANSMISSION OF TEST DATA FOR TESTING INTEGRATED CIRCUITS

BACKGROUND

Description of Related Art

A process in which a die on a wafer is tested is commonly referred to as "wafer sort." Wafer sorting typically involves the use of probing technology wherein mechanical probes extending from a probe engage electrical contact features on a die, and connect the contact features to a tester. FIGS. 1A, and 1B illustrate a typical testing apparatus including a tester 10, a test head 11, and a handler 12, that is used to test the performance of a die on a wafer. As illustrated, a probe card 14 sits below and in contact with test head 11. During testing, the handler supports the wafer on a platform (chuck) 16 and positions the wafer so as to precisely align the die bumps, bond pads or other electrical contact features of a die to be tested with the probe features on the probe card. The chuck 16 is connected to a staging device 18 by rods 17.

The staging device 18 typically positions the chuck along an x-y plane by moving along a stage floor 13 on an actuator assembly such as a ball screw stage assembly or magnetic air bearing, for example. Chuck 16 typically comprises a vacuum chuck wherein the wafer being tested is held in position by drawing a vacuum within a plurality of interconnecting channels that are formed within the surface of the chuck. Once aligned, chuck 16 is raised via rods 17 such that the contact features of the die are forced against the probe features on the probe card.

Probe cards are available in a variety of types such as the passive scrub probe card 20 illustrated in FIG. 2. The probe card 20 has tungsten needle probes 22 with probe tips 23 at one end. The probes 22 are supported by cantilever supports 28.

FIG. 3 illustrates the front side of an integrated circuit device 31. Metal interconnect lines and components (not shown) of the integrated circuit device 31 are formed on an underlying silicon substrate 33 of a die 34. The side of the silicon substrate on which the integrated circuit is formed shall herein be referred to as the front side of the silicon substrate. The integrated circuit device 31 has an active region 35 distributed over the front side of the substrate and containing the majority of the high density, active circuitry of integrated circuit device 31.

To activate the circuitry within active region 35, power signals including voltage and ground signals, and input signals including control, address, clock and data signals are supplied to bond pads which may be positioned on the front side, back side, or both sides of the device 31. FIG. 4 illustrates a view of a bond pad configuration on the integrated circuit device 31, in which the bond pads 37 of integrated circuit device 31 are formed along the back side of the entire integrated circuit device so that the bond pads reside directly over the active circuitry region 35 (FIG. 3) on the front side of the integrated circuit device 31.

FIG. 5 is an illustration of a cross-section of a packaged integrated circuit device 39 which includes the integrated circuit device 31 after mounting to a package substrate 41 with bonds 43. The packaged integrated circuit device 39 may be tested as a whole by plugging the device 39 into a test socket of a test board which provides suitable test signals to the input pins 45 of the device 39 to test the operation of the device 39. Signals generated by the device 39 in response to the supplied signals may be received by the test socket from the output pins 45 and may be recorded and analyzed by the test board.

The integrated circuit device 31 may be tested as a whole before being cut from the wafer and packaged as the packaged integrated circuit device 39 using a testing apparatus similar to that shown in FIG. 1. A probe card having a plurality of probes engages the bond pads 37 to provide suitable test signals to the bond pads of the device 31 to test the operation of the integrated circuit device 31. Signals generated by the integrated circuit device 31 in response to the supplied signals may be received by probes of the probe card and may be recorded and analyzed by the tester.

Still further, portions of the integrated circuit device 31 may be individually tested before the device 31 is cut from the wafer and packaged as the packaged integrated circuit device 39, using a testing apparatus similar to that shown in FIG. 1. However, complex integrated circuits such as microprocessors, for example, may have hundreds of circuits (or more) to be individually tested. The die 34 of FIG. 3 has a number of separate integrated circuit portions $50a$, $50b$ ... $50n$, where n may be in the tens, hundreds or more. Moreover, each integrated circuit portion to be individually tested typically has a number of associated contact features, typically die bumps, to receive and transmit test signals between the testing apparatus and the associated integrated circuit portion. As a consequence, an integrated circuit device such as the device 31 may have thousands of die bumps 52 arranged across the face of the active region 35 on the front side of the device 31 as shown in FIG. 3. Because of the large number of die bumps and relatively small size of the individual integrated circuit portions $50a$, $50b$ ... $50n$ to be tested, the die bumps 52 tend to be relatively small, as small as tens of microns or smaller, and spaced at a pitch as small as a few hundred microns or smaller. Consequently, the probes of the probe card for engaging the die bumps also tend to be very thin in cross-section and very large in number. For example, a probe may have a diameter of twenty microns, or smaller, depending upon the size of the electrical contact to be engaged. Furthermore, a typical probe card may have hundreds or thousands of probes to test the integrated circuit portions $50a$, $50b$ ... $50n$ of an integrated circuit. Thus, probe cards tend to be relatively expensive.

Still further, to send or receive input or output test signals through a probe, a tester typically has an electronic channel card associated with each input/output signal probe to generate or receive the input/output signals passing through the associated probe. A typical tester may have hundreds of such channel cards to test a typical integrated circuit. Thus, testers tend to be relatively expensive as well. As the complexity of integrated circuits continues to grow, the cost and complexity of probe cards and testers for testing the integrated circuits may grow accordingly.

Moreover, each probe and channel card typically has an associated, resistance, inductance and capacitance. As a consequence, in a test set up utilizing hundreds or more test probes and channel cards, the tester and the die may expend a substantial amount of power to drive the input or output loads associated with test probes and channel cards.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

Figure 1A:
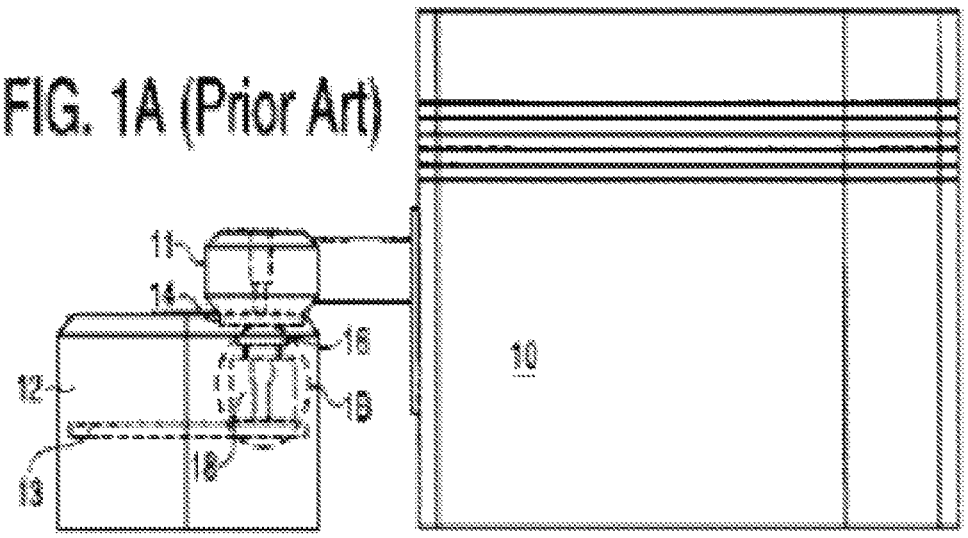
FIG. 1A schematically illustrates a prior art testing apparatus for testing dies.
Figure 2:
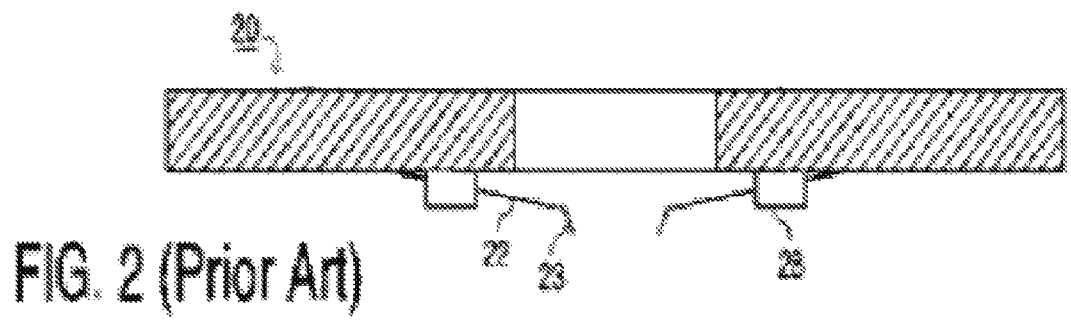
FIG. 2 is a cross-sectional schematic diagram of a prior art probe card for the testing apparatus of FIG. 1.
Figure 1B:
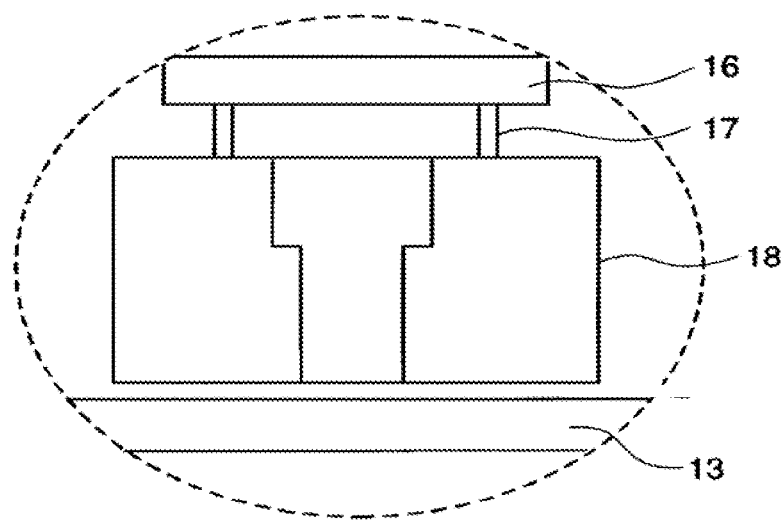
FIG. 1B is a schematic diagram of the chuck and staging device of the testing apparatus of FIG. 1A.
Figure 3:
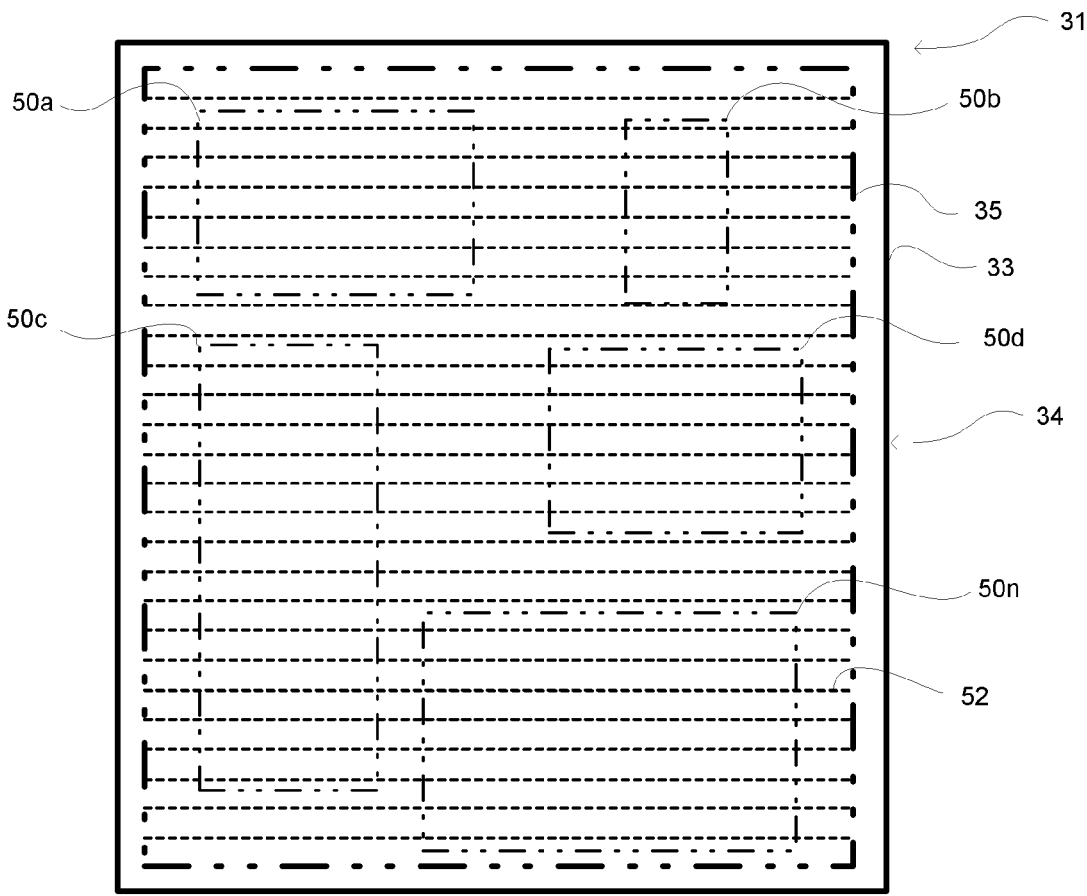
FIG. 3 is a schematic illustration of the front side of a prior art die having integrated circuits to be tested.
Figure 4:
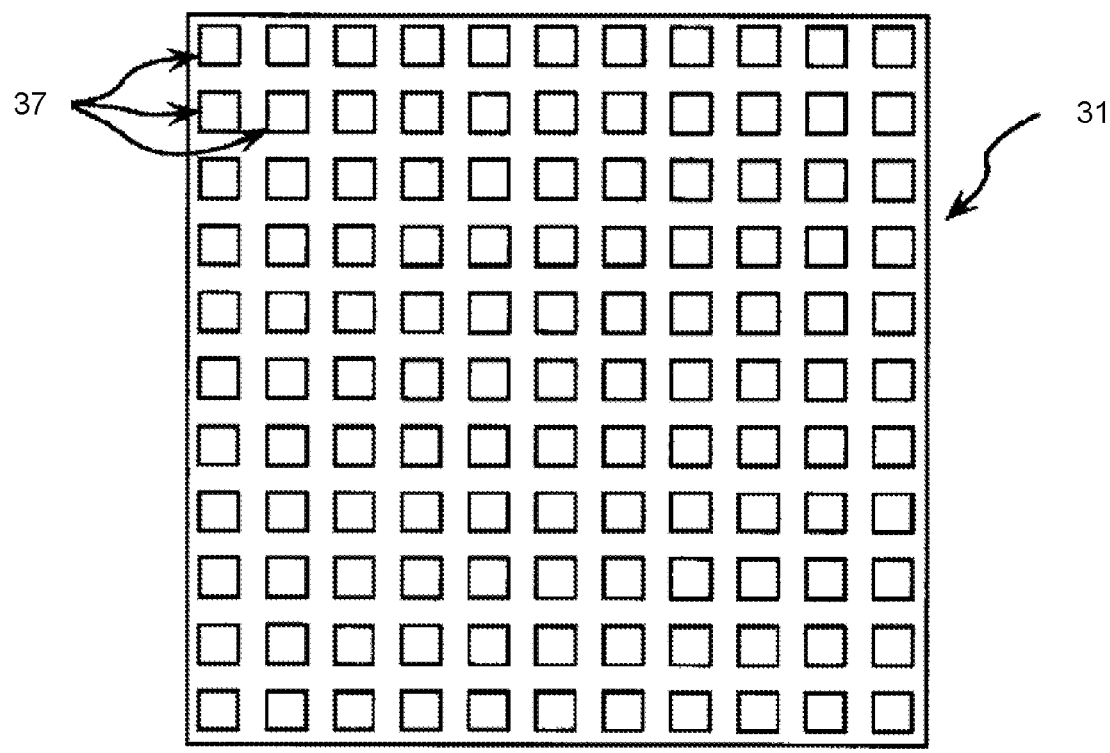
FIG. 4 is a schematic illustration of the back side of a prior art die having integrated circuits to be tested.
Figure 5:
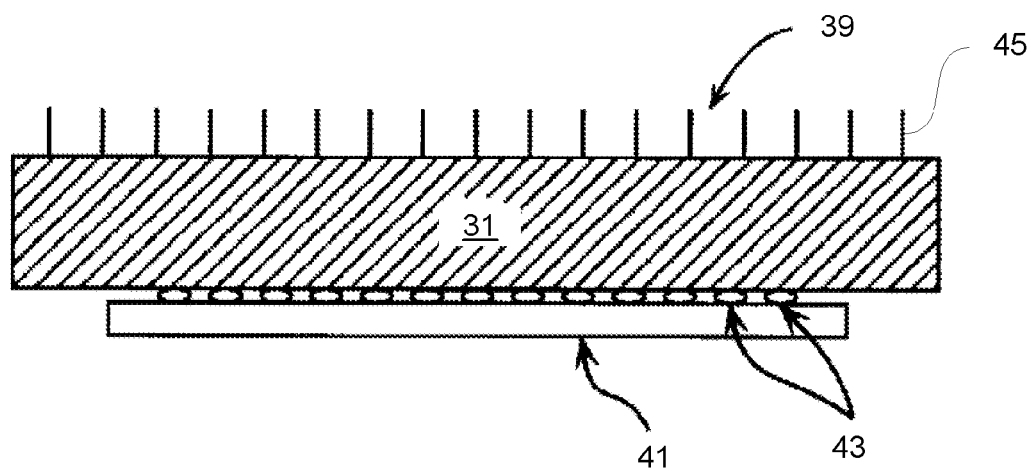
FIG. 5 is a schematic cross-sectional diagram of a prior art package containing a die having integrated circuits.

In the following description, reference is made to the accompanying drawings which form a part hereof and which illustrate several embodiments of the present disclosure. It is understood that other embodiments may be utilized and structural and operational changes may be made without departing from the scope of the present description.

In accordance with one aspect of the present description, integrated circuits may tested by optically transmitting test data over a light beam in addition to or instead of transmitting the test data using mechanical probes. A complex integrated circuit such as a microprocessor, for example, may have hundreds of circuits (or more) to be individually tested. In one aspect of the present invention, test data for each of the circuits of a die to be tested may be combined and used to modulate a laser beam emitted by a tester probe card, for example, to transmit the combined test data optically over the laser beam to a suitable photo-detector disposed on the integrated circuit die to be tested. It is recognized herein that a laser beam can transmit large amounts of test data at very fast data transmission rates to a die to be tested. For example, a laser beam may be modulated to transmit test data to a die at transmission rates in excess of a gigabyte per second including tens or hundreds of gigabytes per second. Thus, test data for each of the hundreds of circuits of a microprocessor die to be tested, for example, may be combined and used to modulate a laser beam to quickly transmit the combined test data for all the circuits to be tested, over the laser beam to a photo-detector disposed on the microprocessor die to be tested.

In another aspect of the present description, the combined test data received at the photo-detector of the die may be demodulated and separated by internal circuitry of the die being tested into separate groups of test data, one group for each individual portion of the integrated circuit die to be tested. Each group of test data may be distributed by the internal circuitry of the die to the individual integrated circuit portion associated with the particular group of test data. The test data of each group may be used to test the associated individual integrated circuit portion and the test results for each individual integrated circuit portion may be transmitted back to the tester.

In one embodiment, test results may be transmitted back to the tester using one or more mechanical probes. In another embodiment, test results may be transmitted back to the tester using a laser or other photon emitter on board the die being tested. A beam of light which has been modulated with the test results may be detected and demodulated by a photo-detector on board the probe card of the tester.

In one embodiment, power and ground signals may be supplied by mechanical probes to the die being tested. However, many of the mechanical probes previously used to transmit test data to individual circuit portions of an integrated circuit on a die may be reduced in number or eliminated. In addition, many of the channel cards previously used to provide test signals to the individual mechanical probes may be reduced in number or eliminated. As a consequence, in some applications, it is believed that the cost of a test apparatus for testing complex integrated circuit dies may be substantially reduced.

Still further, it is believed that testing a large array of integrated circuit dies at one time with a single testing apparatus may be facilitated. In one embodiment, a test probe card of a testing apparatus may have separate photon emitters such as laser diodes to transmit test data separately to a photo-detector of each die of the array over separate beams of light which may be transmitted in parallel. The multiple beams carrying test data may be used to test multiple dies in parallel or sequentially in turn. In another embodiment, a suitable optical assembly may be used to redirect a beam of light carrying test data emitted by one photon emitter, first to one photo-detector of one die, and then to the photo-detector of the next die of the array, to transmit test data to each die of the array in turn.

Figure 6:
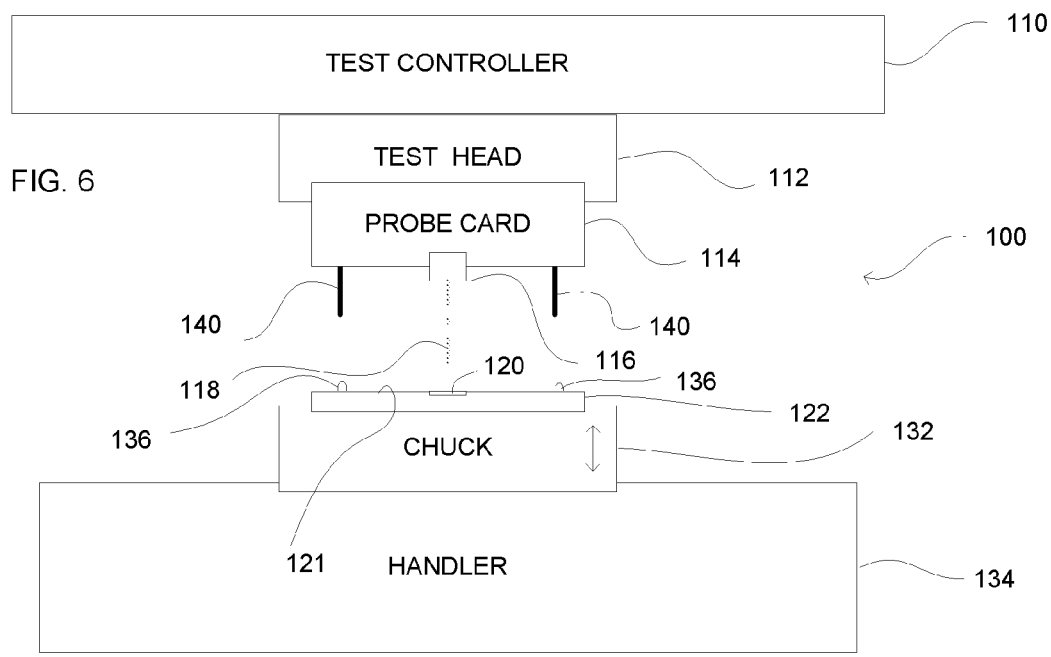
FIG. 6 schematically illustrates a testing apparatus for testing dies in accordance with one embodiment of the present description.

FIG. 6 depicts one example of a testing apparatus 100 in accordance with one embodiment of the present description. The testing apparatus 100 includes a test controller or tester 110, and a test head 112. In accordance with one aspect of the present invention, a probe card 114 includes a photon emitter 116 which may be a laser diode for example, for transmitting test data over a beam 118 of light to a photo-detector 120 on the front side 121 of a die 122 to be tested. It is appreciated that other types of photon emitters may be used as well, depending upon the particular application.

The probe card 114 may be secured by the test head 112 which electrically couples the test controller 110 to the probe card 114. The die 122 is secured by a chuck 132 of a handler 134. The die may be part of a wafer or may have already been cut from the wafer. During testing, the handler 134 under the control of the test controller 110, positions the die so as to precisely align the die bumps, bond pads or other electrical contact features 136 of the die 122 with corresponding mechanical probes 140 of the probe card 114. At the start of the test process, the handler 132 raises the die 122 so that selected electrical contact features 136 of the die 122 physically contact and make electrical connection with corresponding mechanical probes 140 of the probe card.

In this embodiment, some of the mechanical probes 140 are used to supply power (e.g. voltage) and ground signals to the die 122. Thus, although two mechanical probes 140 are depicted in the schematic diagram of FIG. 6, an actual probe card may have hundreds of such mechanical probes for applying power and ground signals to the die 122. Thus, a probe card 114 for a complex microprocessor die, for example, may have in excess of five hundred mechanical probes 140 to supply power to five hundred different die bumps for power signal input on the microprocessor die, and have in excess of 500 mechanical probes 140 to supply ground to five hundred different die bumps for ground signal input on the microprocessor die. In addition, one or more mechanical probes may be used to receive test results data from one or more die bumps or other electrical features on the die 122. Still further, one or more mechanical probes may be used to send/receive test operational data to/from one or more die bumps or other electrical features on the die 122. Such test operational data may include Joint Test Action Group (JTAG) signals, reset signals and clock signals, for example.

Figure 7:
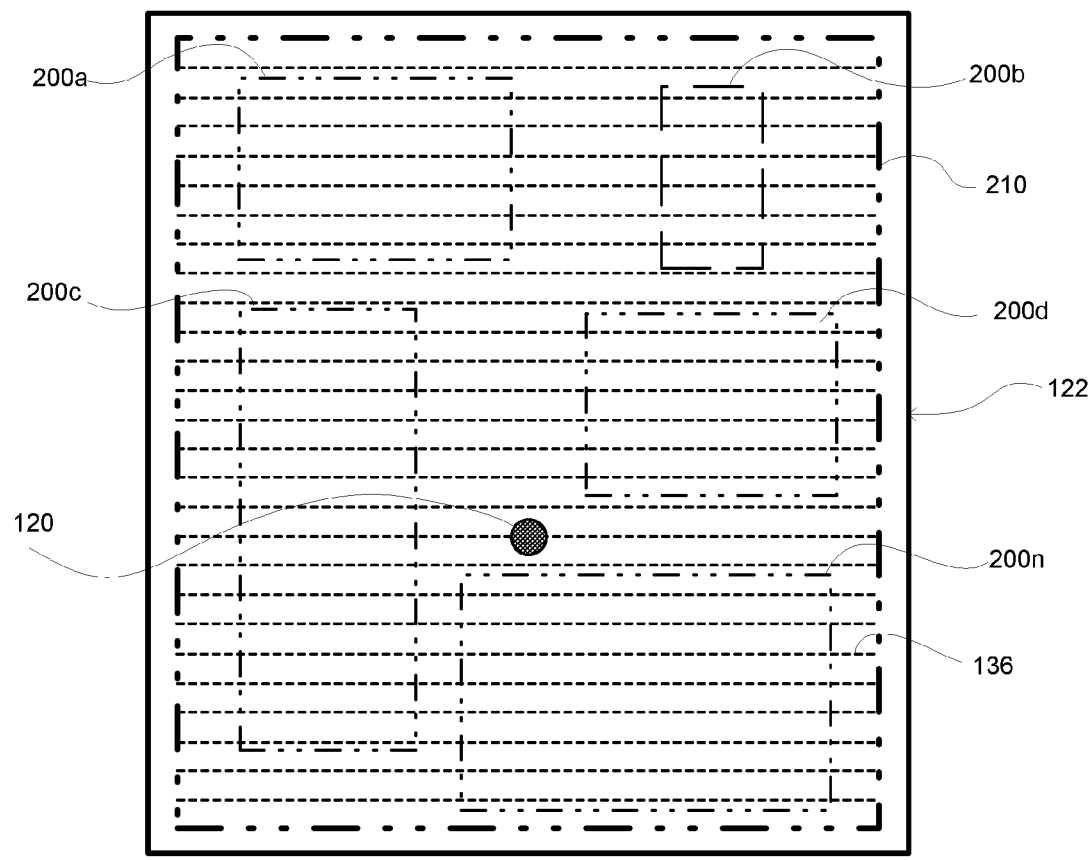
FIG. 7 is a schematic illustration of the front side of a die in accordance with one embodiment of the present description, and having integrated circuits to be tested.

As best seen in FIG. 7, the photo-detector 120 may conveniently be positioned generally in the center of the die 122 which may have many electrical contact features 136 adapted to be engaged by a corresponding mechanical probe 140. In the embodiment of FIG. 7, the die 122 may have hundreds of electrical contact features 136 such as die bumps to receive power and ground signals from the probes 140 of the probe card 114. However, dies to be tested in other applications may have a greater or fewer number of electrical contact features, depending upon the particular application.

In the embodiment of FIG. 7, the photo-detector 120 is used primarily to receive the optically transmitted test data during wafer sort testing. Accordingly, the photo-detector may not be intended to be used during normal operation of the die. Thus, if the die 122 is a microprocessor die, for example, once the die 122 has been tested and packaged, the photo-detector may be covered by packaging and may not be operated again either by the manufacturer or by the consumer when using the die 122 to perform the microprocessor function. It is appreciated however that in some applications, the photo-detector 120 may be used in normal (non-testing) operations of the die 122.

Also, in the embodiment of FIG. 7, the die 122 has a single photo-detector 120 to receive the optically transmitted test data during wafer sort testing. The die 122 has a number of separate integrated circuit portions 200*a*, 200*b* . . . 200*n*, where n may be in the tens, hundreds or more, in an active region 210. Thus, the one photo-detector 120 can receive all the optically transmitted test data for testing all of the separate integrated circuit portions 200*a*, 200*b* . . . 200*n* during wafer sort testing. However, it is appreciated that in other applications, a die to be tested may be have a greater number of photo-detectors for receiving optically transmitted test data, depending upon the particular application.

Figure 8:
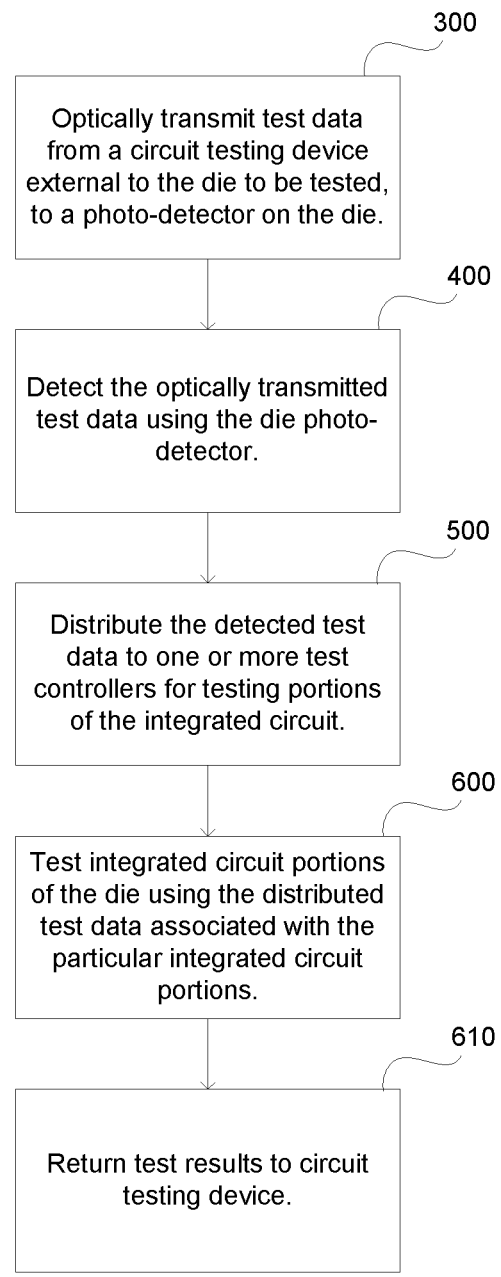
FIG. 8 illustrates operations in accordance with one embodiment for assembling testing a die in accordance with the present description.

FIG. 8 illustrates one embodiment of operations for testing an integrated circuit of a die using optically transmitted test data. In one operation, test data is optically transmitted (block 300) from a circuit testing device external to the die to be tested. The optically transmitted data is beamed to a photo-detector on the die to be tested.

Figure 9:
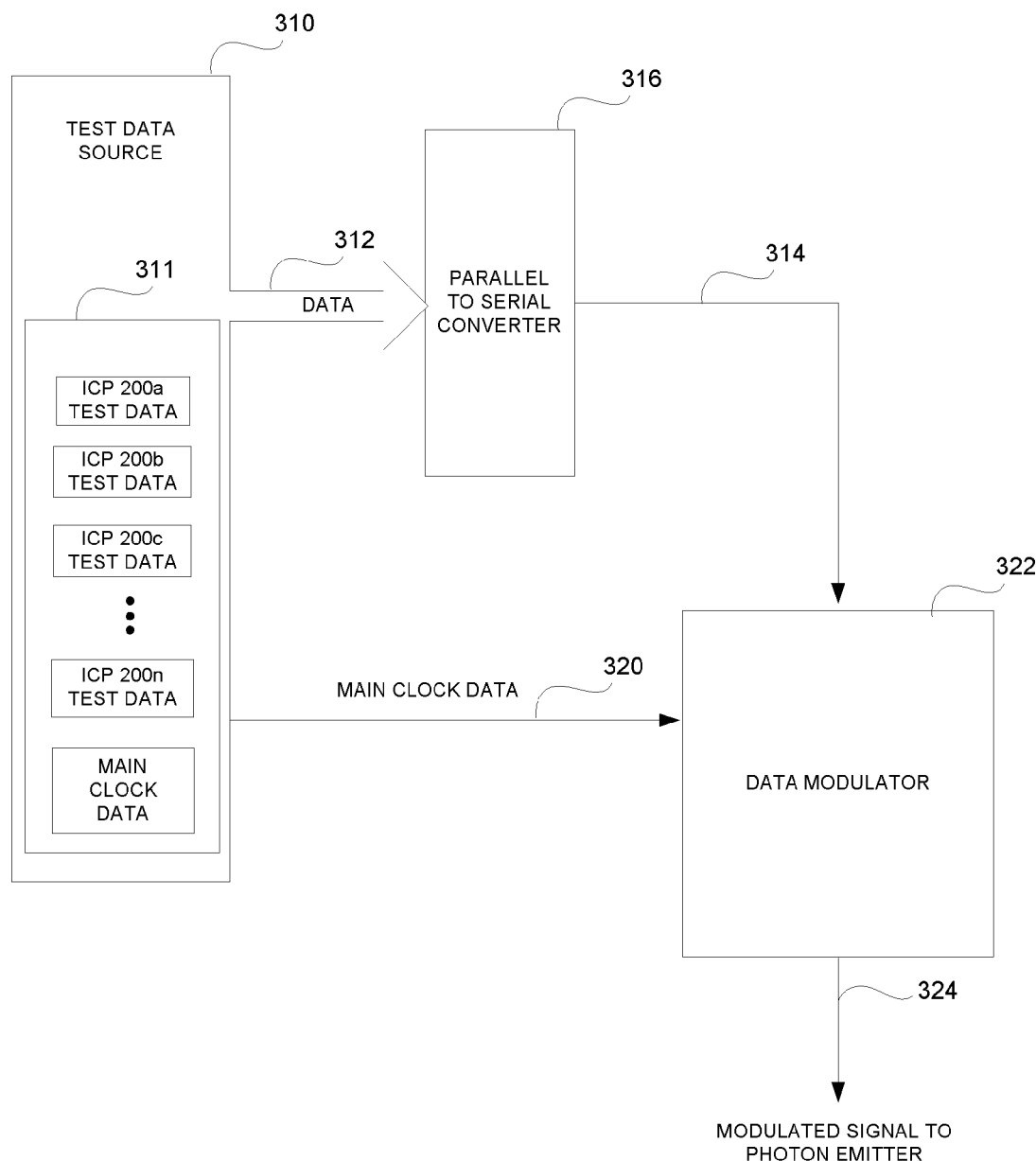
FIG. 9 illustrates an example of apparatus for optically transmitting test data for die testing in accordance with one embodiment of the present description.

For example, FIG. 9 shows a portion of the test controller 110 of the integrated circuit testing apparatus 100, which includes a test data source 310 which provides test data for the integrated circuit to be tested. In the illustrated embodiment, the test data source 310 provides test data for testing each of the integrated circuit portions 200*a*, 200*b* . . . 200*n* of the die 122. The test data may include data for generating test patterns, test codes, control signals, address signals, data signals, clock signals and other test signals appropriate for testing the various integrated circuit portions 200*a*, 200*b* . . . 200*n* of the die 122. In the illustrated embodiment, the test data provided by the test data source 310 includes main clock data to be optically transmitted to the die 122 for overall timing and coordination of the test operations to be performed by the die 122 using the test data optically transmitted by the test controller 110.

The test data provided by the test data source 310 may be stored in a suitable memory 311, generated by suitable signal generators or a combination of both, depending upon the particular application. In one example, test data may be outputted by the test data source 310 in parallel at an output 312 and converted into a stream of serial data bits at an output 314 of a parallel to serial converter 316. In one embodiment, the main clock data may be included with the parallel data output at output 314. In another embodiment, the main clock data may be output separately at an output 320 of the test data source 310 as shown in FIG. 9.

A data modulator 322 inputs the test data from the outputs 314, 320 and generates a modulation signal at an output 324 which is output to the photon emitter 116 (FIG. 6) to modulate the beam 118 output by the photon emitter 116. The beam 118 may be modulated in any suitable fashion to carry the test data. For example, the beam may be modulated to carry the test data in analog form or digital form.

Figure 10:
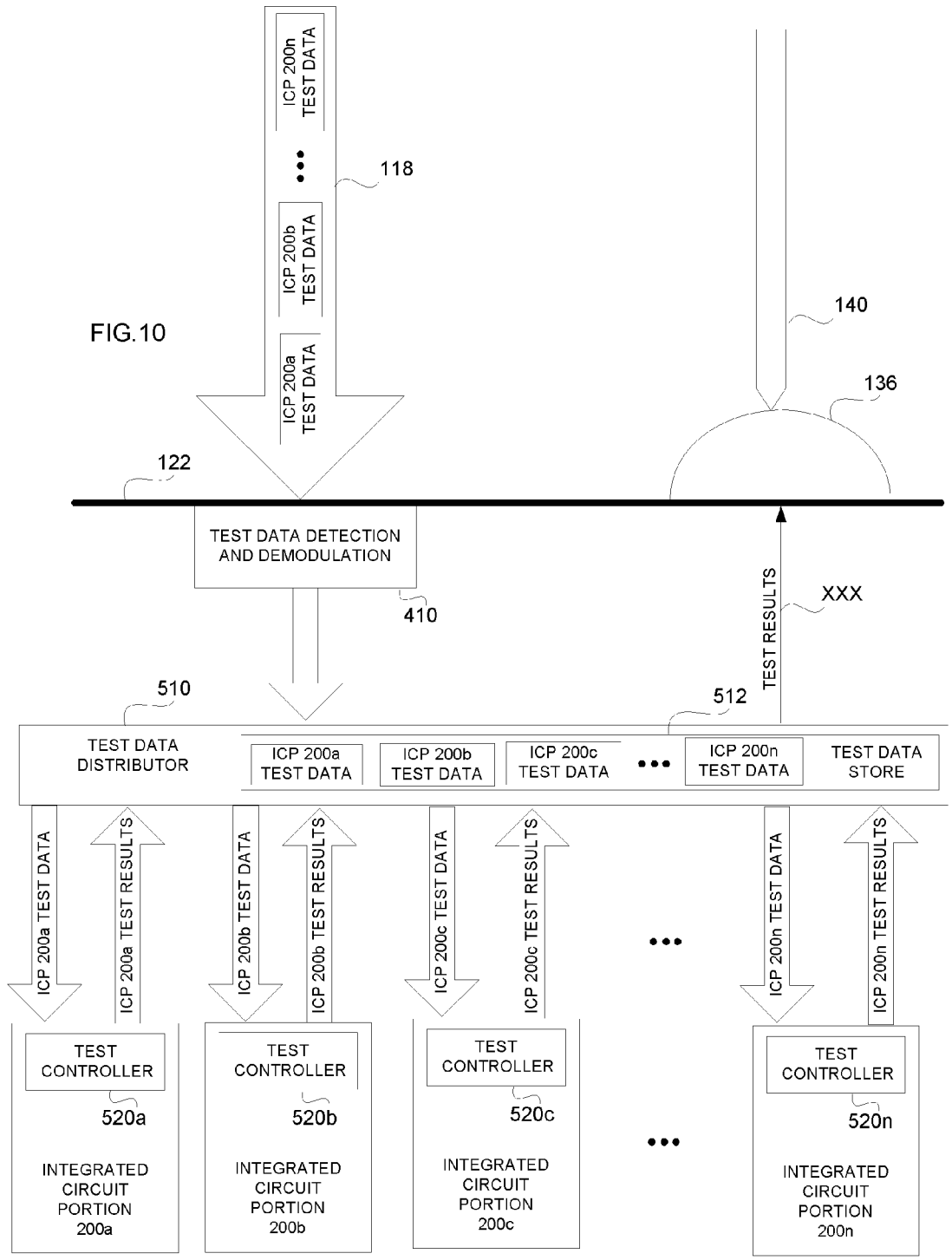
FIG. 10 illustrates an example of a die having apparatus for receiving and distributing optically transmitted test data for die testing in accordance with one embodiment of the present description.

FIG. 10 shows the beam 118 in schematic form carrying the test data for testing the integrated circuit portions (ICP) 200*a*, 200*b* . . . 200*n* of the die 122. The test data may be formatted in any suitable format for data transmission. For example, the test data may be formatted into serial packets, each packet having a header with suitable identification information such as the intended destination and use of the test data for testing the integrated circuit portions 200*a*, 200*b* . . . 200*n* of the die 122. The test data being optically transmitted for testing the integrated circuit portions 200*a*, 200*b* . . . 200*n* of the die 122 may be segregated such that all the test data for testing integrated circuit portion 200*a* may be sent first, all the test data for testing integrated circuit portion 200*b* may be sent next, and so on.

Alternatively, the test data being optically transmitted for testing the integrated circuit portions 200*a*, 200*b* . . . 200*n* of the die 122 may be intermixed such that a first portion of the test data for testing integrated circuit portion 200*a* may be sent first, a first portion of the test data for testing integrated circuit portion 200*b* may be sent next, and so on, followed by a second portion of the test data for testing integrated circuit portion 200*a* which may be sent next, a second portion of the test data for testing integrated circuit portion 200*b* which may be sent next, and so on, until all the test data for testing all the integrated circuit portions 200*a*, 200*b* . . . 200*n* of the die 122 has been optically transmitted.

It is appreciated the that the test data for testing the integrated circuit portions 200a, 200b . . . 200n of the die 122 may be segregated or intermixed in other techniques during optical transmission, depending upon the particular application.

Figure 11:
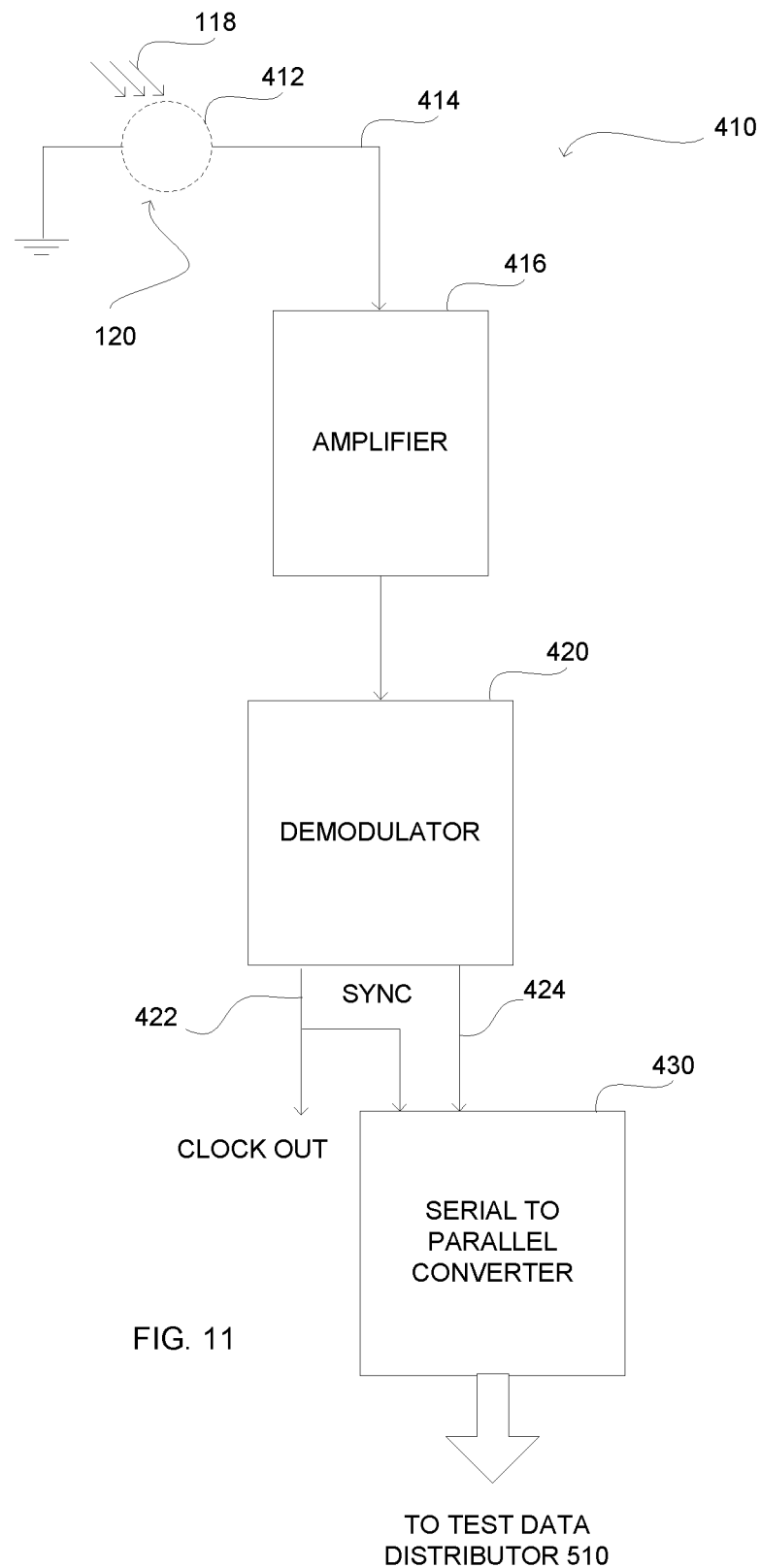
FIG. 11 illustrates an example of a die apparatus for detecting, demodulating and distributing optically transmitted test data for die testing in accordance with one embodiment of the present description.

The optically transmitted data is detected (block 400, FIG. 8) using a photo-detector of the die being tested. FIG. 10 shows for example, the beam 118 from the photon emitter 116 modulated with the test data for testing the integrated circuit portions 200a, 200b . . . 200n, illuminating a test data detection and demodulation circuit 410 which includes the photo-detector 120 of the die 122. FIG. 11 shows an example of a suitable test data detection and demodulation circuit 410 of the die 122 in greater detail. As shown therein, the test data detection and demodulation circuit 410 includes the photo-detector 120 which includes an optically sensitive PIN photodiode 412 for example. It is appreciated that other types of photo-detectors such as avalanche diodes may be used as well, depending upon the particular application.

When the photodiode 412 is illuminated by the beam 118 which has been modulated with the test data from the test controller 110, the photodiode generates a current at an output 414. The output current of the photodiode 412 is similarly modulated as the beam 118, such that the output current also carries the test data from the test controller 110. An amplifier 416 amplifies the output current and a demodulation circuit 420 demodulates the amplified output current to extract the test data carried by the amplified output current.

In the illustrated embodiment, the demodulation circuit 420 can extract a clock signal such as the main clock signal provided by the test controller 110 at a separate clock output 422. The remainder of the test data extracted from the amplified current may be output as a serial stream of digital data at a data output 424 separate from the clock output 422 but synchronously with the main clock signal output at the clock output 422. As previously mentioned, the main clock signal may be used by the testing circuitry of the die 122 for overall timing and coordination of the test operations to be performed by the die 122 using the test data optically transmitted by the test controller 110. The serial stream of data from the demodulation circuit output 424 may be converted back to parallel data by a serial to parallel converter circuit 430 and stored in a suitable memory for distribution to the various integrated circuit portions 200a, 200b . . . 200n. It is appreciated that in other applications, a clock signal such as a main clock signal may not be extracted separately from the rest of the test data before the test data is stored or distributed.

The optically transmitted (block 300, FIG. 8) test data detected (block 400, FIG. 8) by the photo-detector circuit and extracted by the demodulator circuits may be sorted by destination as needed, and distributed (block 500, FIG. 8) to one or more test controllers for the various integrated circuit portions 200a, 200b . . . 200n to be tested. FIG. 10 shows a test data distributor circuit 510 which includes a test data store or memory 512 for storing the integrated circuit portion (ICP) 200a, 200b, 200c, . . . 200n test data from the test data detection and demodulation circuit 410. In the illustrated embodiment, each integrated circuit portion 200a, 200b, 200c, . . . 200n to be tested has an associated test controller 520a, 520b, 520c, . . . 520n. The test data distributor circuit 510 distributes the integrated circuit portion (ICP) 200a, 200b, 200c, . . . 200n test data stored in the store 512 to the associated test controller 520a, 520b, 520c, . . . 520n of the associated integrated circuit portion (ICP) 200a, 200b, 200c, . . . 200n. Thus, the test data distributor circuit 510 distributes the integrated circuit portion (ICP) 200a test data stored in the store 512 to the associated test controller 520a of the associated integrated circuit portion (ICP) 200a, distributes the integrated circuit portion (ICP) 200b test data stored in the store 512 to the associated test controller 520b of the associated integrated circuit portion (ICP) 200b, and so on.

Although the test controllers 520a, 520b, 520c, . . . 520n are depicted as being part of the associated integrated circuit portion 200a, 200b, 200c, . . . 200n, it is appreciated that the test controllers 520a, 520b, 520c, . . . 520n may be physically located elsewhere on the die 122, depending upon the particular application. In addition, although the test controllers 520a, 520b, 520c, . . . 520n are depicted as being separate circuits, it is appreciated that the functions of the test controllers 520a, 520b, 520c, . . . 520n may be performed by one or more combined test controllers to perform the tests for the associated integrated circuit portions 200a, 200b, 200c, . . . 200n.

The optically transmitted (block 300, FIG. 8) test data detected (block 400, FIG. 8) by the photo-detector circuit and extracted by the demodulator circuits, and distributed (block 500, FIG. 8) to one or more test controllers, may be used to test (block 600, FIG. 8) the integrated circuit such as the integrated circuit portions 200a, 200b. In the illustrated embodiment, each test controller 520a, 520b, 520c, . . . 520n uses the associated integrated circuit portion (ICP) 200a, 200b, 200c, . . . 200n test data distributed to the particular test controller 520a, 520b, 520c, . . . 520n by the distributor circuit 510, to generate the appropriate test signals to test the associated integrated circuit portion (ICP) 200a, 200b, 200c, . . . 200n. Thus, the test controller 520a uses the associated integrated circuit portion (ICP) 200a test data distributed to the test controller 520a by the distributor circuit 510, to generate the appropriate test signals to test the associated integrated circuit portion (ICP) 200a, the test controller 520b uses the associated integrated circuit portion (ICP) 200b test data distributed to the test controller 520b by the distributor circuit 510, to generate the appropriate test signals to test the associated integrated circuit portion (ICP) 200b, and so on. The tests performed by the test controllers 520a, 520b, 520c, . . . 520n for the associated integrated circuit portion (ICP) 200a, 200b, 200c, . . . 200n may be timed with reference to the main clock signal provided by the test data detection and demodulation circuit 410 or other suitable clock signal.

The test signals generated by the test controller 520a, 520b, 520c, . . . 520n using the associated integrated circuit portion (ICP) 200a, 200b, 200c, . . . 200n test data, include test patterns, test codes, control signals, address signals, data signals, clock signals and any other signal appropriate to test the circuits of the associated integrated circuit portion (ICP) 200a, 200b, 200c, . . . 200n. The circuits to be tested in an integrated circuit portion (ICP) 200a, 200b, 200c, . . . 200n may include logic circuitry including interconnected AND, NAND, OR and NOR gates, memory circuits, registers, shift registers and so on. In the example of a die 122 containing a multi-core microprocessor or multi-core graphics processor, the circuits in an integrated circuit portion (ICP) 200a, 200b, 200c, . . . 200n may include a processor core or a portion of a processor core, for example.

Upon completion of the tests performed by the test controllers 520a, 520b, 520c, . . . 520n for the associated integrated circuit portion (ICP) 200a, 200b, 200c, . . . 200n, test results may be returned (block 610, FIG. 8) to the circuit testing device. In the illustrated embodiments, upon completion of a particular test by one of the test controllers 520a, 520b, 520c, . . . 520n for the associated integrated circuit portion (ICP) 200a, 200b, 200c, . . . 200n, test results may be returned to the data distributor 510 which collects and forwards test results data to one or more die bumps 136 of the die 122 being tested. The test results may be transmitted by back to the test controller 110 through a mechanical test probe 140 engaging a test result die bump.

Figure 12:
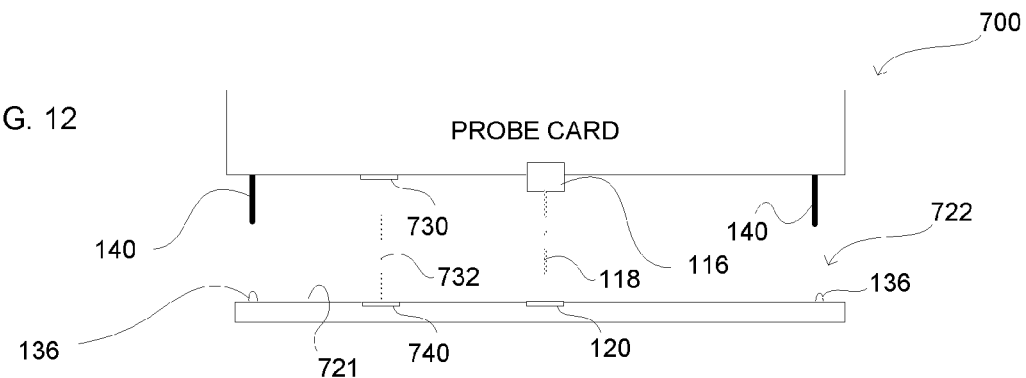
FIG. 12 illustrates an example of apparatus for optically transmitting test data for die testing and for optically transmitting test results data in accordance with one embodiment of the present description.

FIG. 12 shows an example of an alternative embodiment in which test results data may be optically transmitted instead of transmitted over a mechanical probe. In the embodiment of FIG. 12, a probe card 700 includes a photon emitter 116 which may be a laser diode for example, for transmitting test data over a beam 118 of light to a photo-detector 120 on the front side 721 of a die 722 to be tested. The probe card 700 may further include a photo-detector 730 positioned to receive a beam 732 emitted by a photon emitter 740 disposed on the front side 721 of the die 722 to be tested. The photon emitter 740, like the photon emitter 116, may be a laser diode for example, for transmitting test results data over the beam 732 of light to the photo-detector 730 on the probe card 700. The die may have a suitable modulator circuit to modulate the beam 732 to carry the test results data from the die 722. Similarly, the probe card 700 may have a demodulator circuit to demodulate the detected beam to extract the test results data. The probe card 700 may, in this embodiment, have mechanical probes 140 used to supply power (e.g. voltage) and ground signals to die bumps 136 on the die 722.

Figure 13:
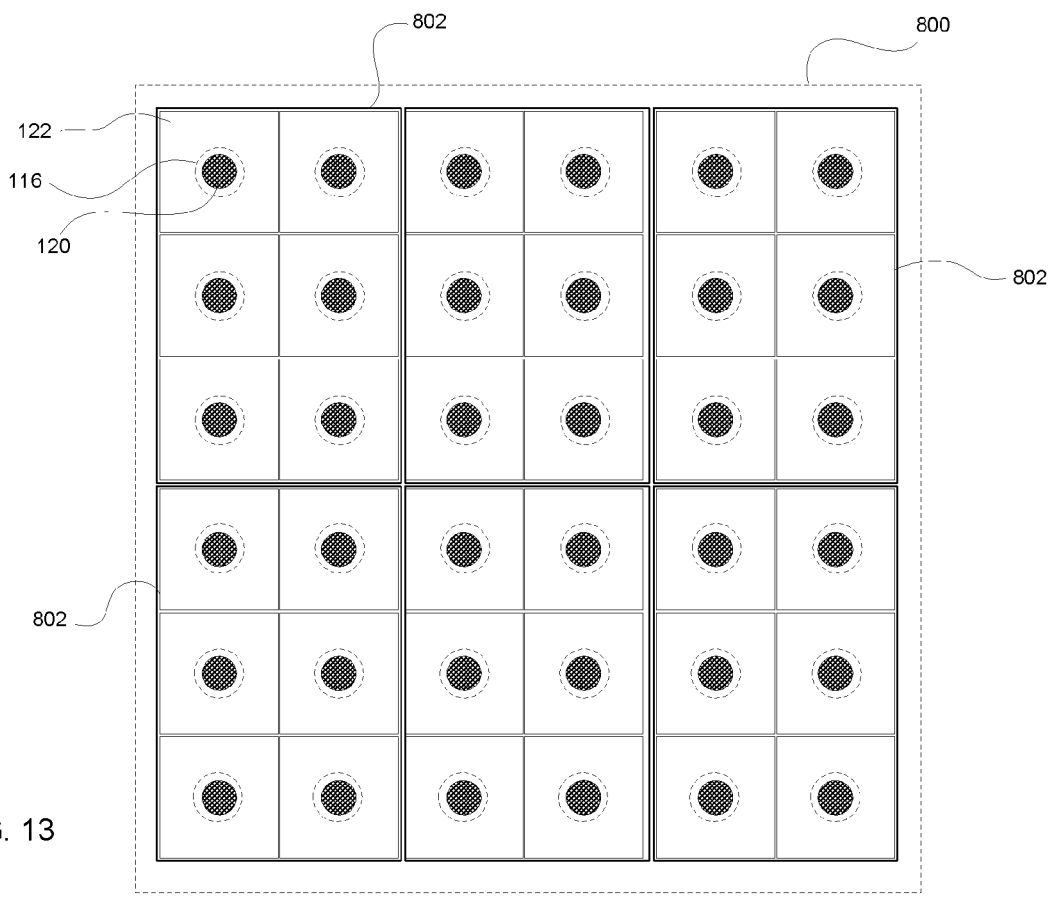
FIG. 13 illustrates an example of an apparatus for optically transmitting test data for testing an array of dies in accordance with one embodiment of the present description.

As previously mentioned, by optically transmitting test data which may include test results data, using photon emitters and detectors rather than mechanical probes, it is believed that the number of mechanical probes and hence the cost of a probe card may be reduced. As a consequence, optical transmission of test data may facilitate testing a relatively large number of dies using a single probe card. For example, FIG. 13 shows a probe card 800 (indicated in phantom) disposed over a six by six array of dies 122, each die 122 having a photo-detector 120 for receiving optically transmitted test data. The array of dies 122 includes a three by two array of die printing reticles 802, each reticle 802 including a two by three array of dies 122 for a total of thirty-six dies 122 in the array of dies 122 depicted in FIG. 13.

In the example of FIG. 13, the probe card 800 may have a corresponding six by six array of photon emitters 116 (depicted in phantom), each photon emitter 116 being aligned and positioned to emit a beam of light carrying test data to a corresponding photo-detector 120 of the array of dies 122. The mechanical probes for supplying power, ground and operational test signals have been omitted for clarity. The thirty-six dies 122 may be tested simultaneously in some applications. In other applications, the dies may be tested in turn but, in one embodiment, the array of dies 122 need not be moved until testing of each of the dies of the array has been completed. Although a six by six array of dies is depicted for a corresponding probe card having a corresponding six by six array of photon emitters, it is appreciated that the number of dies having photo-detectors and the number of photon emitters in the array of photon emitters of the probe card may vary, depending upon the particular application.

Figure 14:
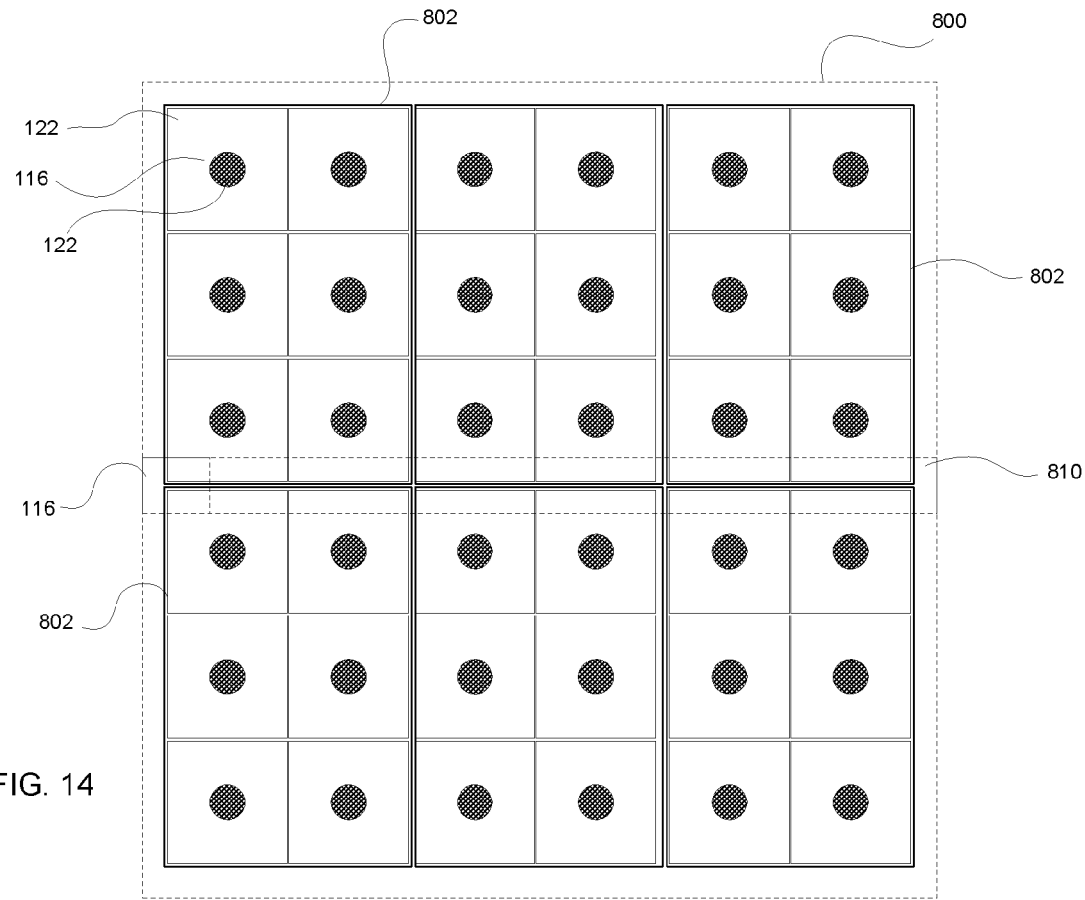
FIG. 14 illustrates another example of apparatus for optically transmitting test data for testing an array of dies in accordance with another embodiment of the present description.

In the embodiment of FIG. 13, the probe card 800 is depicted as having a separate photon emitter 116 for each photo-detector 120 of the array of dies 122 being tested. However, it is appreciated that in some applications, suitable optical assemblies may be used to direct optically transmitted test data from fewer photon emitters. For example, an optical assembly 810 of FIG. 14 may include beam splitters, micro-mirrors or other suitable optical apparatus to direct a test data carrying beam emitted a single photon emitter 116 of the probe card to multiple dies 122 being tested. Thus, the optical assembly 810 can redirect a beam emitted by the photon emitter 116 of FIG. 14 to a first photo-detector 120 of a first die 122 being tested, and then to the photo-detector 120 of the next die 122 to be tested, and so on, without moving the array of dies, in some embodiments.

Additional Embodiment Details

The described techniques for may be embodied as a method, apparatus, computer program product or article of manufacture using standard programming and/or engineering techniques to produce software, firmware, hardware, or any combination thereof. The outputs of on-die circuitry which may include programmable processors, dedicated processors, comparators or adder/subtractor circuits, may be processed by on-die logic circuitry, firmware or software or processed by off chip logic circuitry, firmware or software, or a combination thereof, to process optically transmitted data. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, a die having an on board photo-detector for receiving optically transmitted test data in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the photonic package embodiments may be embodied in a computing device that does not include, for example, a video controller, such as a switch, router, etc, or does not include a network controller, for example.

The illustrated logic of FIG. 8 shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 15:
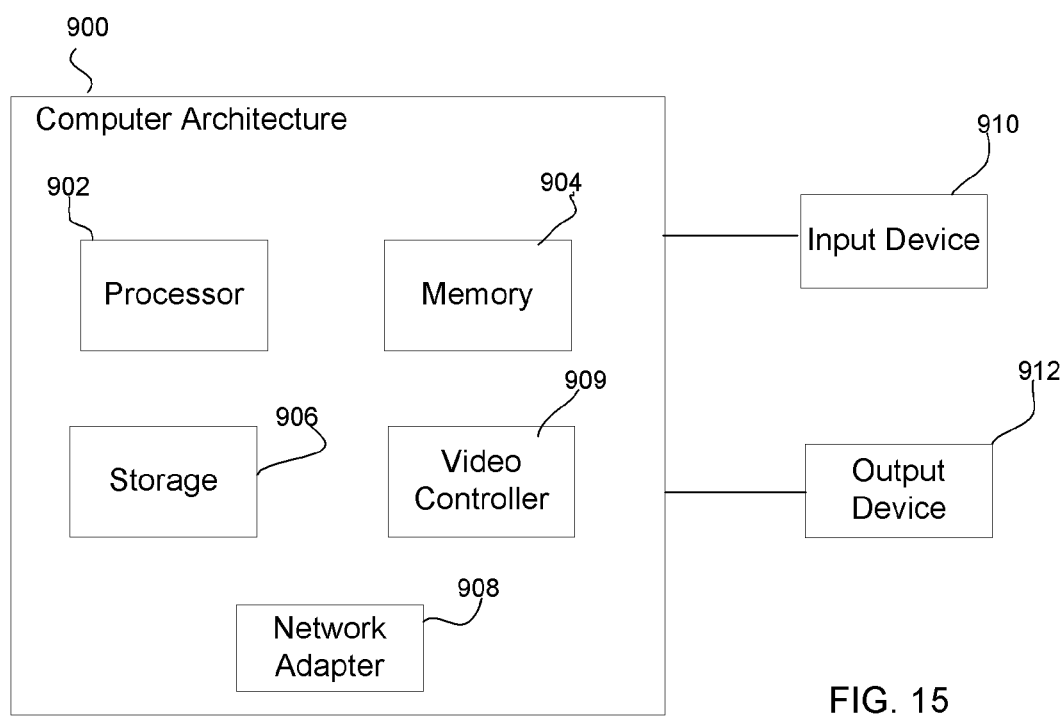
FIG. 15 illustrates an embodiment of a system utilizing a die having apparatus for receiving and distributing optically transmitted test data for die testing in accordance with one embodiment of the present description.

FIG. 15 illustrates one embodiment of a computer architecture 900 of components, any one of which may include a die having an on board photo-detector for receiving optically transmitted test data in accordance with the present description. The computer architecture 900 may comprise any computing device known in the art, such as a mainframe, server, personal computer, workstation, laptop, handheld computer, telephony device, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having an on-die conversion testing circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A method, comprising:
   testing an integrated circuit of a die, said testing comprising:
   optically transmitting test data from a circuit testing device external to the die, to a photo-detector on the integrated circuit of the die;
   detecting the optically transmitted test data using the photo-detector;
   distributing detected test data to a circuit portion of the integrated circuit; and
   testing the circuit portion using the distributed test data;
   wherein the testing further comprises receiving a stream of clock data and parallel streams of test data; converting the stream of clock data and the parallel streams of test data to a serial stream of test data and clock data and modulating an optical beam illuminating the photo-detector to transmit the serial stream of test data and clock data to the photo-detector.

2. The method of claim 1 wherein the testing further comprises applying power and ground to the integrated circuit using mechanical probes engaging the integrated circuit.

3. The method of claim 1 wherein the optically transmitting includes modulating a laser beam illuminating the photo-detector to transmit the test data to the photo-detector.

4. The method of claim 1 wherein the testing further comprises:
   optically transmitting clock data with the test data to the photo-detector on the integrated circuit of the die;
   detecting the optically transmitted clock data using the photo-detector;
   demodulating from the detected clock data and test data, test data and clock signals wherein the test data signals are synchronized with the clock signals demodulated from the clock test data;
   distributing demodulated clock data synchronized with the demodulated test data to the circuit portion of the integrated circuit; and
   testing the circuit portion using the distributed test and clock data.

5. The method of claim 1 further comprising demodulating from the detected clock and test data, a serial stream of test data synchronized with the clock data and wherein the distributing detected test data includes converting the serial stream of test data demodulated from the detected test data, to parallel data, storing the parallel data in a memory of the integrated circuit and distributing test data from the memory to the associated integrated circuit portion for testing the associated circuit portion using the test data associated with each circuit portion.

6. The method of claim 1 further comprising collecting results of the testing of the circuit portion using the distributed test data and transmitting the test results to the circuit testing device external to the die.

7. The method of claim 6 wherein the transmitting the test results includes transmitting the test results through a mechanical probe engaging a conductor on the die.

8. The method of claim 6 wherein the transmitting the test results includes optically transmitting the test results using a photon emitter disposed on the die, to a photo-detector of the circuit testing device.

9. The method of claim 6 further comprising:
   testing a plurality of integrated circuits of a plurality of dies arranged in an array, said plurality die testing comprising:
   optically transmitting test data from a circuit testing device external to the plurality of dies, to a photo-detector on the integrated circuit of each die of the plurality of dies;
   detecting optically transmitted test data using the photo-detector of the integrated circuit of each die of the plurality of dies;
   distributing detected test data to a circuit portion of the integrated circuit of each die of the plurality of dies; and
   testing the circuit portion of the integrated circuit of each die of the plurality of dies using distributed test data;
   wherein the optically transmitting external to the plurality of dies includes modulating a plurality of laser beams arranged in an array, and illuminating the photo-detectors of each die of the array, to transmit the test data to the photo-detector photo-detectors of each die of the array.

* * * * *